United States Patent
Ding et al.

[11] Patent Number: 6,057,237
[45] Date of Patent: May 2, 2000

[54] TANTALUM-CONTAINING BARRIER LAYERS FOR COPPER

[75] Inventors: Peijun Ding, San Jose; Tony Ping-Chen Chiang, Mountain View, both of Calif.

[73] Assignee: Applied Materials, Inc., Santa Clara, Calif.

[21] Appl. No.: 08/841,058

[22] Filed: Apr. 29, 1997

[51] Int. Cl.⁷ .................................................. H01L 21/44
[52] U.S. Cl. ......................... 438/687; 438/653; 257/751
[58] Field of Search ..................... 438/687, 751, 438/653, FOR 350, FOR 352; 257/751

[56] References Cited

U.S. PATENT DOCUMENTS 5,391,517  2/1995  Gelatos et al. ......................... 437/190
5,676,587  10/1997  Landers et al. ............................ 451/57

*Primary Examiner*—Olik Chaudhuri
*Assistant Examiner*—Ginette Peralta
*Attorney, Agent, or Firm*—Birgit E. Morris

[57] ABSTRACT

An improved barrier layer of tantalum to prevent diffusion of copper into a dielectric layer or silicon substrate is made by alternately sputter depositing thin amorphous tantalum layers and tantalum nitride layers. The resultant wholly amorphous tantalum-containing layer leads to a stronger barrier and prevents formation of a columnar structure in thick tantalum layers. The sputter depositions of tantalum and tantalum nitride can be repeated until the desired thickness of the barrier is obtained.

4 Claims, 2 Drawing Sheets

TANTALUM-CONTAINING BARRIER LAYERS FOR COPPER

This invention relates to depositing improved tantalum barrier layers for overlying copper metal lines in the manufacture of semiconductor devices. More particularly, this invention relates to the deposition of tantalum-containing barrier layers having enhanced barrier performance.

BACKGROUND OF THE INVENTION

In the manufacture of semiconductor devices, conductive metal contacts and lines are deposited over dielectric layers, such as silicon oxide. The metal lines connect various devices to each other to form integrated circuits. Openings are made in the dielectric layer and filled with a conductive material so that contact between overlying lines and underlying devices can also be made.

As devices become smaller and more devices are made in a single semiconductor (silicon) wafer, the openings in the dielectric layer have a smaller diameter. These small diameter openings are difficult to fill, particularly using conventional sputter deposition processing.

FIG. 1 illustrates a conventional sputtering chamber. A vacuum chamber 10 includes a target 12 of the material to be sputtered and a substrate support 14. A source of DC power 13 is connected to the target 12. A pair of opposed magnets 16 and 18 are mounted on top of the target 12. A power source 20, such as a source of RF power, is connected to the substrate support 14. During sputter deposition, a substrate 22 is mounted on the substrate support 14. A gas inlet 19 permits gases to be passed into the chamber. Argon is generally used as a sputtering gas. The argon is ionized in the chamber and is attracted to the target 12 by the magnets 16, 18. The argon atoms strike the surface of the target and sputter off particles of target material which deposit on the substrate 22. If a material such as a nitride is to be formed on the substrate, nitrogen gas is also passed into the chamber where it is ionized and reacts with sputtered metal on the substrate.

Since sputtered particles are sputtered from a target in numerous random directions, comparatively few of the sputtered particles impact the target in a direction perpendicular to the substrate. Most of the sputtered particles thus impact the openings in the substrate at some other angle, causing the sputtered layer to build up along the sides and top of an opening rather than on the bottom. Further, as the aspect ratio of the opening becomes higher, it is even more difficult to cover the bottom of the opening. This top and side buildup creates an overhang over the opening, as shown in FIG. 2, which further prevents particles from depositing on the bottom of the opening. FIG. 2 illustrates an opening 100 partially filled with sputtered metal 110.

Aluminum has been widely used for the manufacture of conductive lines and contacts, but more recently copper has been tried. Copper is more conductive than aluminum, but has a similar problem as aluminum with respect to an underlying silicon substrate., i.e., at elevated temperatures the copper diffuses and reacts with other materials in the integrated circuit, and thus a barrier layer needs to be deposited between the conductive metal and the substrate.

Tantalum and tantalum nitride have been accepted as good barrier materials for copper to prevent the diffusion of copper into underlying layers. Tantalum can be deposited by sputtering, and, when sputtered in the presence of nitrogen, tantalum nitride is formed. Tantalum nitride is not as conductive as tantalum, and it has a tendency to peel off the underlying substrate, probably due to high stress in the tantalum nitride film. This peeling also has the disadvantage that it causes the formation of particles, which is always undesirable.

Tantalum is a better conductor and a better wetting agent, and thus is a good adhesive between copper and the underlying substrate. However, the use of tantalum alone has the disadvantage that it is not as good a barrier as tantalum nitride. Thus efforts to improve tantalum-containing barrier layers for copper have continued.

SUMMARY OF THE INVENTION

We have found that by alternately depositing layers of tantalum and tantalum nitride, improved barrier layers for copper metal conductors are obtained.

DETAILED DESCRIPTION OF THE INVENTION

X-ray diffraction results have shown that sputter deposited tantalum nitride has a highly amorphous structure that contributes to its excellent barrier properties. We have also found that when tantalum alone is deposited into an opening in silicon oxide, the amorphous silicon oxide structure causes the initial tantalum layer to be amorphous as well. This provides an initial dense tantalum layer. However, as the tantalum layer becomes thicker, the structure of the layer changes so that a loose, columnar structure is formed. This structure is not as good a barrier because an overlying metal layer, such as of copper, can move or diffuse along the columnar pathways to the underlying substrate.

Thus in accordance with the present process, after an initial dense amorphous tantalum layer is sputter deposited, a layer of amorphous tantalum nitride is deposited over the amorphous tantalum layer by adding nitrogen gas to the sputtering chamber. This tantalum nitride layer prevents formation of a columnar structure in the growing tantalum film. Thus by alternately depositing tantalum and tantalum nitride layers, a dense amorphous barrier layer that is adherent to the substrate is deposited. If a thicker barrier layer is required, the tantalum and tantalum nitride depositions can be repeated as many times as are necessary to form the barrier layer thickness required. The tantalum nitride can also be deposited as the first layer, alternating with tantalum.

Figure 1:
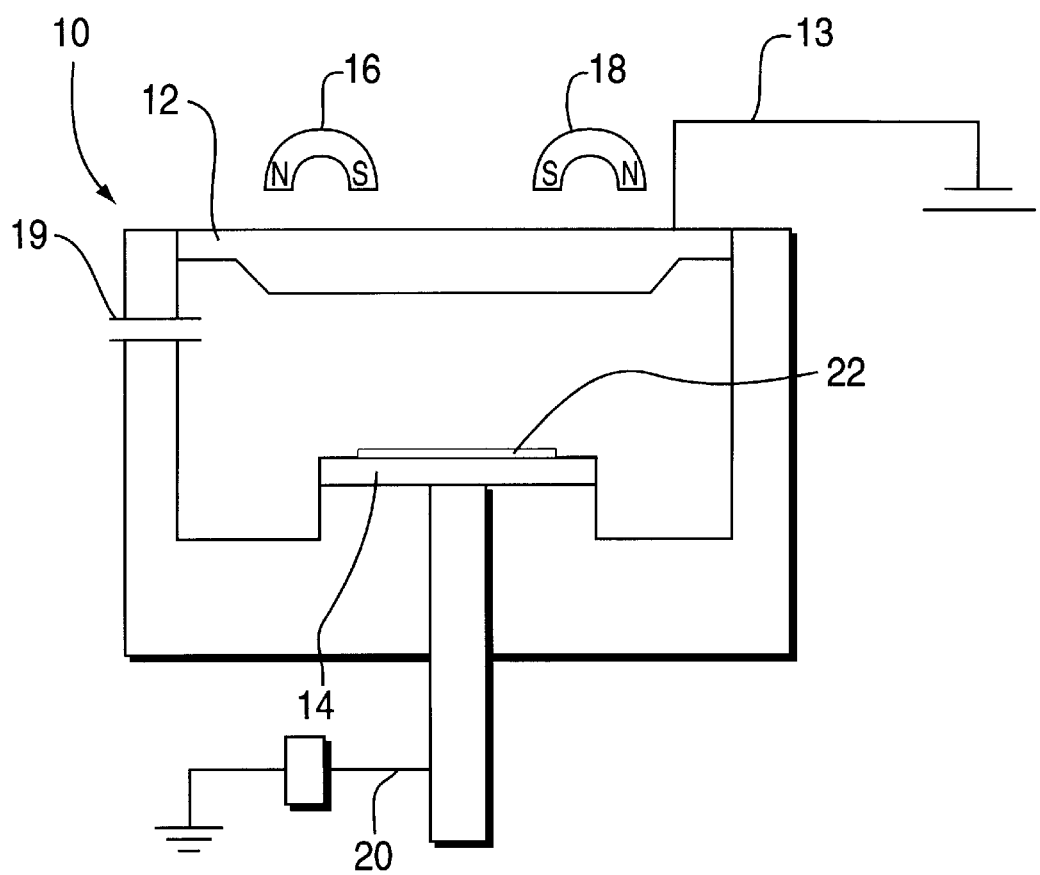
FIG. 1 is a schematic cross sectional view of a cnventional sputtering chamber.
Figure 2:
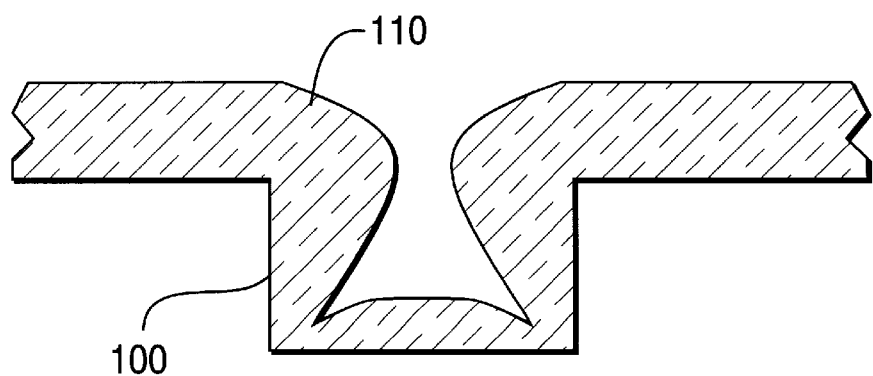
FIG. 2 is a schematic cross sectional view of a partially sputter filled opening in accordance with the prior art.
Figure 3:
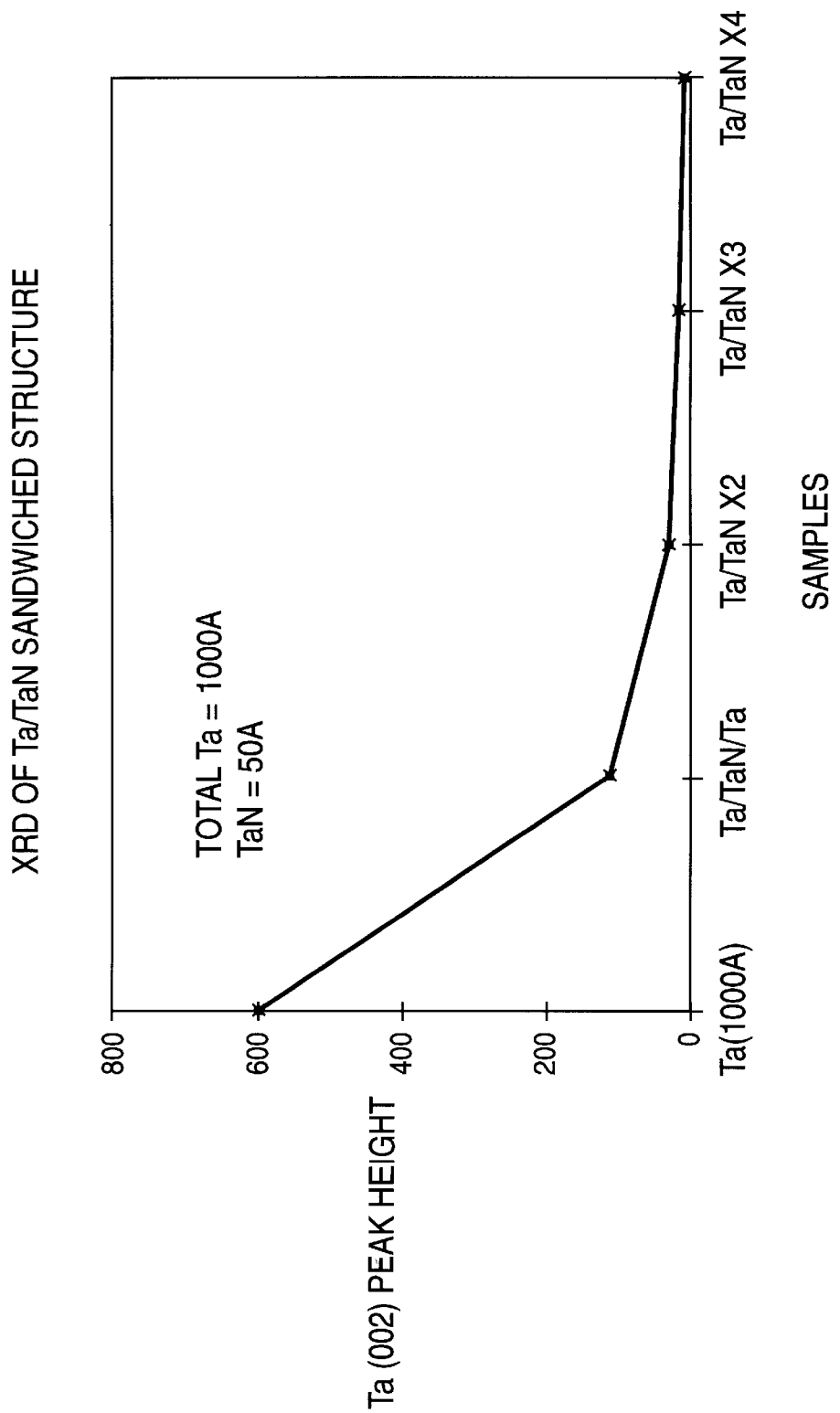
FIG. 3 is an X-ray diffraction study of tantalum/tantalum nitride sandwiched films.

FIG. 3 is an X-ray diffraction study of tantalum (002 crystal orientation) versus the number of alternating tantalum and tantalum nitride layers. Deposition of tantalum alone (1000 Å thick) becomes less crystalline when a tantalum nitride layer is sandwiched between two tantalum layers. The total tantalum thickness is fixed at 1000 Å in the study. As the layering is repeated, the composite becomes still more amorphous and dense, and very little crystallinity is to be seen.

Another advantage to the present process and structure is that less nitrogen is used in the composite film than when tantalum nitride is deposited alone. This reduces the high film stress characteristic of tantalum nitride. High film stress contributes to a lack of adhesion between a barrier layer and a substrate, and results in barrier layer peeling, and the consequent formation of particles. Thus in accordance with the present process, particle reduction is also obtained.

The opening, now lined with a dense, wholly amorphous tantalum-containing layer, can be filled with copper, also by sputtering, to form a highly conductive via that has improved barrier properties that prevent diffusion of copper into an adjacent dielectric material during subsequent processing steps.

Although the invention has been described in terms of specific embodiments, the invention is only meant to be limited by the scope of the appended claims.

We claim:

1. A method of making amorphous barrier layers to line an opening to be filled with copper comprising
   a) sputter depositing a first layer selected from the group consisting of tantalum and tantalum nitride in said opening;
   b) sputter depositing a second layer of the other of tantalum and tantalum nitride to line the bottom and sidewalls of the opening; and
   c) alternately repeating steps a) and b) until the layer is substantially amorphous.

2. A method according to claim 1 wherein the first layer is tantalum and the second layer is tantalum nitride.

3. A method according to claim 1 wherein the first layer is tantalum nitride and the second layer is tantalum.

4. A method of making a conductive via comprising
   a) sputter depositing a first layer selected from the group consisting of tantalum and tantalum nitride in said opening,
   b) sputter depositing a second layer of tantalum and tantalum nitride to line the bottom and sidewalls of the opening;
   c) alternately repeating steps a) and b) until a preselected thickness of the liner is obtained and the liner is substantially amorphous, and
   d) filling said opening with copper.

* * * * *